(12) United States Patent
Anderson

(10) Patent No.: US 8,832,166 B2
(45) Date of Patent: Sep. 9, 2014

(54) FLOATING POINT MULTIPLIER CIRCUIT WITH OPTIMIZED ROUNDING CALCULATION

(75) Inventor: Timothy David Anderson, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 261 days.

(21) Appl. No.: 13/247,963

(22) Filed: Sep. 28, 2011

(65) Prior Publication Data

US 2012/0197954 A1    Aug. 2, 2012

Related U.S. Application Data

(60) Provisional application No. 61/387,283, filed on Sep. 28, 2010.

(51) Int. Cl.
| | |
|---|---|
| *G06F 7/00* | (2006.01) |
| *H03K 21/00* | (2006.01) |
| *G06F 7/483* | (2006.01) |
| *H03K 19/00* | (2006.01) |
| *G06F 1/32* | (2006.01) |

(52) U.S. Cl.
CPC ............... *H03K 21/00* (2013.01); *G06F 7/483* (2013.01); *H03K 19/0016* (2013.01); *G06F 1/3296* (2013.01)
USPC ............................ 708/209; 708/495; 708/497

(58) Field of Classification Search
None
See application file for complete search history.

(56) References Cited

U.S. PATENT DOCUMENTS

| | | | | |
|---|---|---|---|---|
| 4,896,286 | A | * | 1/1990 | Ueda .............................. 708/505 |
| 5,128,889 | A | * | 7/1992 | Nakano ......................... 708/497 |
| 5,684,729 | A | * | 11/1997 | Yamada et al. ................ 708/505 |
| 5,757,686 | A | * | 5/1998 | Naffziger et al. .............. 708/501 |
| 5,928,316 | A | * | 7/1999 | Wong et al. .................... 708/501 |

\* cited by examiner

*Primary Examiner* — Michael D Yaary

(74) *Attorney, Agent, or Firm* — Robert D. Marshall, Jr.; Frederick J. Telecky, Jr.

(57) ABSTRACT

An optimized floating point multiplier rounding circuit that minimizes the increase of the critical timing path of the calculation. The values of the temporary mantissa required to make the rounding decision are calculated simultaneously by the circuit shown in the invention.

1 Claim, 3 Drawing Sheets

(1) L1I CACHE MISS FILL FROM L2
(2) L1D CACHE MISS FILL FROM L2
(3) L1D WRITE MISS TO L2, OR L1D VICTIM TO L2, OR L1D SNOOP RESPONSE TO L2
(4) L2 CACHE MISS FILL, OR DMA INTO L2
(5) L2 VICTIM WRITE BACK, OR DMA OUT OF L2
(6) DMA INTO L2
(7) DMA OUT OF L2

US 8,832,166 B2

FLOATING POINT MULTIPLIER CIRCUIT WITH OPTIMIZED ROUNDING CALCULATION

CLAIM OF PRIORITY

This application claims priority under 35 USC 119(e)(1) to U.S. Provisional Application No. 61/387,283 filed Sep. 28, 2010.

TECHNICAL FIELD OF THE INVENTION

This invention relates in general to the field of computing systems and more particularly to arithmetic processing units.

BACKGROUND OF THE INVENTION

Floating point multiplication results in a temporary mantissa which has about 2× more bits of precision than the result can be stored in (which is the original mantissa width). The IEEE floating point specification defines several very specific rounding modes to define how the temporary mantissa should be rounded and then truncated to fit the needed mantissa size for the result.

The rounding calculation in prior art always adds to the critical path in some fashion.

SUMMARY OF THE INVENTION

This invention shows how to simultaneously calculate the three values needed for correct rounding:
1) The value of the mantissa if there is no rounding
2) The value of the mantissa if we should round up, and there is no additional left shift by one to extract the mantissa
3) The value of the mantissa if we should round up, and there is an additional left shift by one to extract the mantissa.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
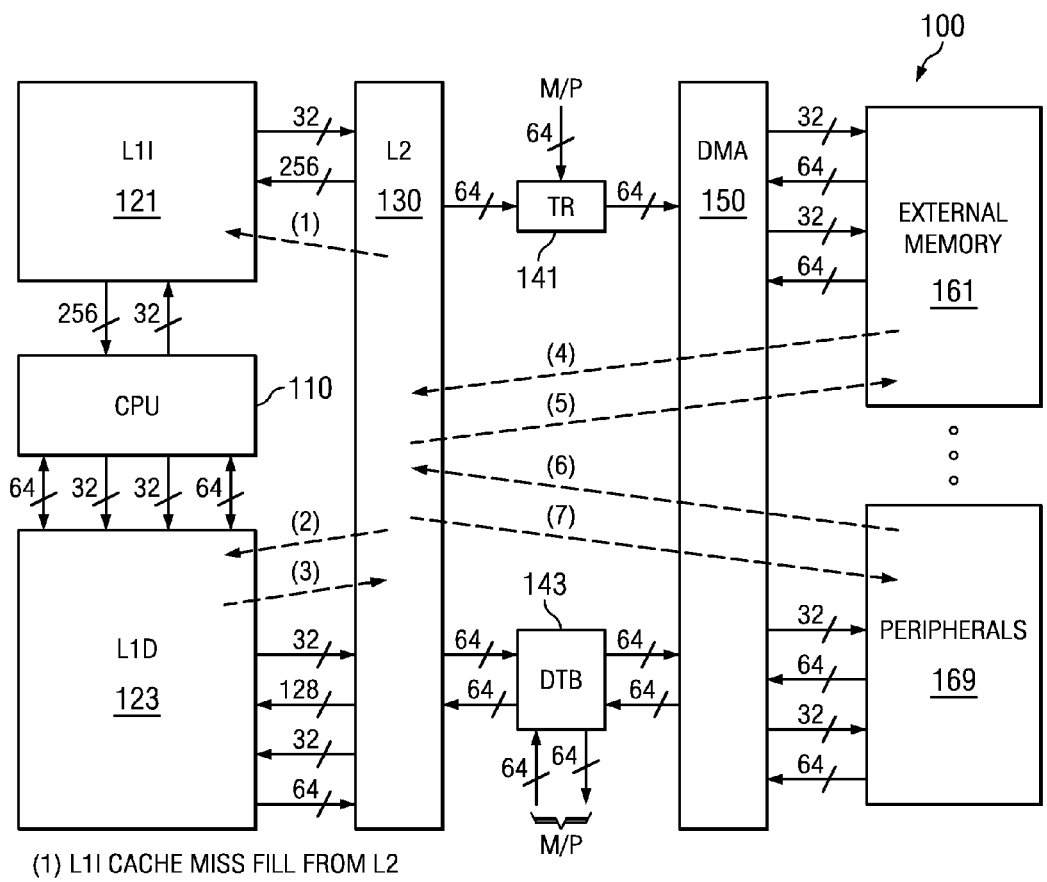
FIG. 1 illustrates the organization of a typical digital signal processor to which this invention is applicable (prior art)

FIG. 1 illustrates the organization of a typical digital signal processor system 100 to which this invention is applicable (prior art). Digital signal processor system 100 includes central processing unit core 110. Central processing unit core 110 includes the data processing portion of digital signal processor system 100. Central processing unit core 110 could be constructed as known in the art and would typically includes a register file, an integer arithmetic logic unit, an integer multiplier and program flow control units. An example of an appropriate central processing unit core is described below in conjunction with FIGS. 2 to 4.

Digital signal processor system 100 includes a number of cache memories. FIG. 1 illustrates a pair of first level caches. Level one instruction cache (L1I) 121 stores instructions used by central processing unit core 110. Central processing unit core 110 first attempts to access any instruction from level one instruction cache 121. Level one data cache (L1D) 123 stores data used by central processing unit core 110. Central processing unit core 110 first attempts to access any required data from level one data cache 123. The two level one caches are backed by a level two unified cache (L2) 130. In the event of a cache miss to level one instruction cache 121 or to level one data cache 123, the requested instruction or data is sought from level two unified cache 130. If the requested instruction or data is stored in level two unified cache 130, then it is supplied to the requesting level one cache for supply to central processing unit core 110. As is known in the art, the requested instruction or data may be simultaneously supplied to both the requesting cache and central processing unit core 110 to speed use.

Level two unified cache 130 is further coupled to higher level memory systems. Digital signal processor system 100 may be a part of a multiprocessor system. The other processors of the multiprocessor system are coupled to level two unified cache 130 via a transfer request bus 141 and a data transfer bus 143. A direct memory access unit 150 provides the connection of digital signal processor system 100 to external memory 161 and external peripherals 169.

Figure 2:
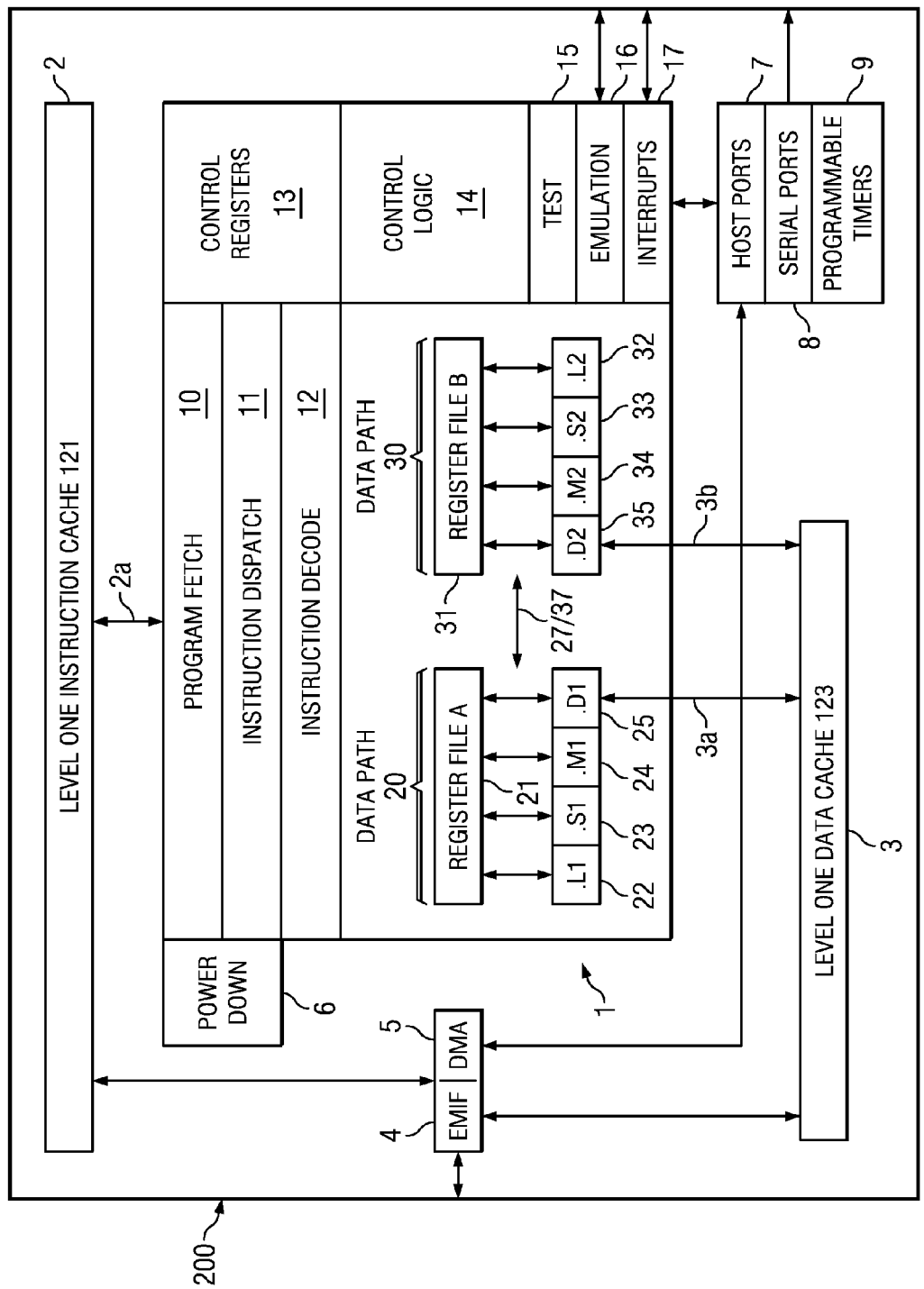
FIG. 2 illustrates details of a very long instruction word digital signal processor core suitable for use in FIG. 1 (prior art)

FIG. 2 is a block diagram illustrating details of a digital signal processor integrated circuit 200 suitable but not essential for use in this invention (prior art). The digital signal processor integrated circuit 200 includes central processing unit 1, which is a 32-bit eight-way VLIW pipelined processor. Central processing unit 1 is coupled to level one instruction cache 121 included in digital signal processor integrated circuit 200. Digital signal processor integrated circuit 200 also includes level one data cache 123. Digital signal processor integrated circuit 200 also includes peripherals 4 to 9. These peripherals preferably include an external memory interface (EMIF) 4 and a direct memory access (DMA) controller 5. External memory interface (EMIF) 4 preferably supports access to supports synchronous and asynchronous SRAM and synchronous DRAM. Direct memory access (DMA) controller 5 preferably provides 2-channel auto-boot loading direct memory access. These peripherals include power-down logic 6. Power-down logic 6 preferably can halt central processing unit activity, peripheral activity, and phase lock loop (PLL) clock synchronization activity to reduce power consumption. These peripherals also include host ports 7, serial ports 8 and programmable timers 9.

Central processing unit 1 has a 32-bit, byte addressable address space. Internal memory on the same integrated circuit is preferably organized in a data space including level one data cache 123 and a program space including level one instruction cache 121. When off-chip memory is used, preferably these two spaces are unified into a single memory space via the external memory interface (EMIF) 4.

Level one data cache 123 may be internally accessed by central processing unit 1 via two internal ports 3a and 3b. Each internal port 3a and 3b preferably has 32 bits of data and a 32-bit byte address reach. Level one instruction cache 121 may be internally accessed by central processing unit 1 via a single port 2a. Port 2a of level one instruction cache 121 preferably has an instruction-fetch width of 256 bits and a 30-bit word (four bytes) address, equivalent to a 32-bit byte address.

Central processing unit 1 includes program fetch unit 10, instruction dispatch unit 11, instruction decode unit 12 and two data paths 20 and 30. First data path 20 includes four functional units designated L1 unit 22, S1 unit 23, M1 unit 24 and D1 unit 25 and 16 32-bit A registers forming register file 21. Second data path 30 likewise includes four functional units designated L2 unit 32, S2 unit 33, M2 unit 34 and D2 unit 35 and 16 32-bit B registers forming register file 31. The functional units of each data path access the corresponding register file for their operands. There are two cross paths 27 and 37 permitting access to one register in the opposite register file each pipeline stage. Central processing unit 1 includes control registers 13, control logic 14, test logic 15, emulation logic 16 and interrupt logic 17.

Program fetch unit 10, instruction dispatch unit 11 and instruction decode unit 12 recall instructions from level one instruction cache 121 and deliver up to eight 32-bit instructions to the functional units every instruction cycle. Processing occurs simultaneously in each of the two data paths 20 and 30. As previously described each data path has four corresponding functional units (L, S, M and D) and a corresponding register file containing 16 32-bit registers. Each functional unit is controlled by a 32-bit instruction. The data paths are further described below. A control register file 13 provides the means to configure and control various processor operations.

Figure 3:
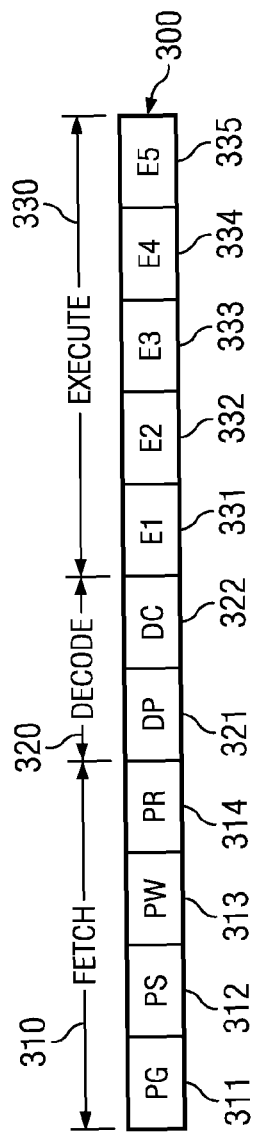
FIG. 3 illustrates the pipeline stages of the very long instruction word digital signal processor core illustrated in FIG. 2 (prior art)

FIG. 3 illustrates the pipeline stages 300 of digital signal processor core 110 (prior art). These pipeline stages are divided into three groups: fetch group 310; decode group 320; and execute group 330. All instructions in the instruction set flow through the fetch, decode, and execute stages of the pipeline. Fetch group 310 has four phases for all instructions, and decode group 320 has two phases for all instructions. Execute group 330 requires a varying number of phases depending on the type of instruction.

The fetch phases of the fetch group 310 are: Program address generate phase 311 (PG); Program address send phase 312 (PS); Program access ready wait stage 313 (PW); and Program fetch packet receive stage 314 (PR). Digital signal processor core 110 uses a fetch packet (FP) of eight instructions. All eight of the instructions proceed through fetch group 310 together. During PG phase 311, the program address is generated in program fetch unit 10. During PS phase 312, this program address is sent to memory. During PW phase 313, the memory read occurs. Finally during PR phase 314, the fetch packet is received at CPU 1.

The decode phases of decode group 320 are: Instruction dispatch (DP) 321; and Instruction decode (DC) 322. During the DP phase 321, the fetch packets are split into execute packets. Execute packets consist of one or more instructions which are coded to execute in parallel. During DP phase 322, the instructions in an execute packet are assigned to the appropriate functional units. Also during DC phase 322, the source registers, destination registers and associated paths are decoded for the execution of the instructions in the respective functional units.

The execute phases of the execute group 330 are: Execute 1 (E1) 331; Execute 2 (E2) 332; Execute 3 (E3) 333; Execute 4 (E4) 334; and Execute 5 (E5) 335. Different types of instructions require different numbers of these phases to complete. These phases of the pipeline play an important role in understanding the device state at CPU cycle boundaries.

During E1 phase 331, the conditions for the instructions are evaluated and operands are read for all instruction types. For load and store instructions, address generation is performed and address modifications are written to a register file. For branch instructions, branch fetch packet in PG phase 311 is affected. For all single-cycle instructions, the results are written to a register file. All single-cycle instructions complete during the E1 phase 331.

During the E2 phase 332, for load instructions, the address is sent to memory. For store instructions, the address and data are sent to memory. Single-cycle instructions that saturate results set the SAT bit in the control status register (CSR) if saturation occurs. For single cycle 16 by 16 multiply instructions, the results are written to a register file. For M unit non-multiply instructions, the results are written to a register file. All ordinary multiply unit instructions complete during E2 phase 322.

During E3 phase 333, data memory accesses are performed. Any multiply instruction that saturates results sets the SAT bit in the control status register (CSR) if saturation occurs. Store instructions complete during the E3 phase 333.

During E4 phase 334, for load instructions, data is brought to the CPU boundary. For multiply extension instructions, the results are written to a register file. Multiply extension instructions complete during the E4 phase 334.

During E5 phase 335, load instructions write data into a register. Load instructions complete during the E5 phase 335.

Figure 4:
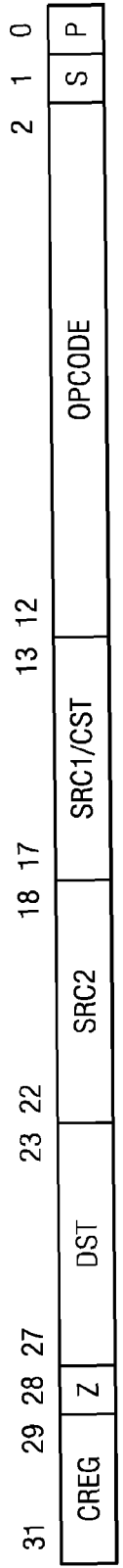
FIG. 4 illustrates the instruction syntax of the very long instruction word digital signal processor core illustrated in FIG. 2 (prior art)

FIG. 4 illustrates an example of the instruction coding of instructions used by digital signal processor core 110 (prior art). Each instruction consists of 32 bits and controls the operation of one of the eight functional units. The bit fields are defined as follows. The creg field (bits 29 to 31) is the conditional register field. These bits identify whether the instruction is conditional and identify the predicate register. The z bit (bit 28) indicates whether the predication is based upon zero or not zero in the predicate register. If z=1, the test is for equality with zero. If z=0, the test is for nonzero. The case of creg=0 and z=0 is treated as always true to allow unconditional instruction execution. The creg field is encoded in the instruction opcode as shown in Table 1.

TABLE 1

| Conditional | creg | | | z |
|---|---|---|---|---|
| Register | 31 | 30 | 29 | 28 |
| Unconditional | 0 | 0 | 0 | 0 |
| Reserved | 0 | 0 | 0 | 1 |
| B0 | 0 | 0 | 1 | z |
| B1 | 0 | 1 | 0 | z |
| B2 | 0 | 1 | 1 | z |
| A1 | 1 | 0 | 0 | z |
| A2 | 1 | 0 | 1 | z |
| A0 | 1 | 1 | 0 | z |
| Reserved | 1 | 1 | 1 | x |

Note that "z" in the z bit column refers to the zero/not zero comparison selection noted above and "x" is a don't care state. This coding can only specify a subset of the 32 registers in each register file as predicate registers. This selection was made to preserve bits in the instruction coding.

The dst field (bits 23 to 27) specifies one of the 32 registers in the corresponding register file as the destination of the instruction results.

The scr2 field (bits 18 to 22) specifies one of the 32 registers in the corresponding register file as the second source operand.

The scr1/cst field (bits 13 to 17) has several meanings depending on the instruction opcode field (bits 3 to 12). The first meaning specifies one of the 32 registers of the corresponding register file as the first operand. The second meaning is a 5-bit immediate constant. Depending on the instruction type, this is treated as an unsigned integer and zero extended to 32 bits or is treated as a signed integer and sign extended to 32 bits. Lastly, this field can specify one of the 32 registers in the opposite register file if the instruction invokes one of the register file cross paths 27 or 37.

The opcode field (bits 3 to 12) specifies the type of instruction and designates appropriate instruction options. A detailed explanation of this field is beyond the scope of this invention except for the instruction options detailed below.

The s bit (bit 1) designates the data path 20 or 30. If s=0, then data path 20 is selected. This limits the functional unit to L1 unit 22, S1 unit 23, M1 unit 24 and D1 unit 25 and the corresponding register file A 21. Similarly, s=1 selects data path 20 limiting the functional unit to L2 unit 32, S2 unit 33, M2 unit 34 and D2 unit 35 and the corresponding register file B 31.

The p bit (bit 0) marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to eight instructions. Each instruction in an execute packet must use a different functional unit.

Additional instructions and circuits need to be implemented for efficient floating point calculations. In computer architecture applications, it is often necessary to compute the sum of two N-bit numbers while also adding or subtracting a $2^N$ constant (where k<N) to or from the recently computed sum of the same two N-bit numbers. This situation often arises more specifically in memory address calculation during load and store operations, where memory calculations such as A+B, A+B+8 and A+B−8 are performed (where, e.g., k=3, and thus, 2 3=8). Because the speed of memory accesses often limits the speed of a computer, the speed of the computation of these calculations is typically a primary speed limitation of computer processing units (CPUs). Conventional approaches used to calculate A+B, A+B+$2^N$ and A+B−$2^N$ are often either slow due to serially producing the results or relatively large (and power consuming) by duplicating adder hardware.

The problems noted above are solved in large by predicting the effect of incrementing and/or decrementing a sum of A and B at a $k^{th}$ bit position. A predictive adder produces the result of incrementing and/or decrementing a sum of A and B by a one-bit constant of the form 2k, where k is a bit position at which the sum is to be incremented or decremented. The predictive adder predicts the ripple portion of bits in the potential sum of the first operand A and the second operand B that would be toggled by incrementing or decrementing the sum A+B by the one-bit constant to generate an indication of the ripple portion of bits in the potential sum. The predictive adder uses the indication of the ripple portion of bits in the potential sum and the carry output generated by evaluating A+B to produce the results of at least one of A+B+$2^k$ and A+B−$2^k$%.

This invention is an improvement of U.S. patent application Ser. No. 13/178,508 THREE-TERM PREDICTIVE ADDER AND/OR SUBTRACTER filed Jul. 8, 2011.

The rounding calculation employed in the prior art always adds to the critical timing path in some fashion. The circuit disclosed in the above patent application reduces this critical path by allowing to simultaneously calculate three values required for rounding:

The value of the mantissa if there is no rounding

The value of the mantissa if we should round up, and there is no additional left shift by one to extract the mantissa The value of the mantissa if we should round up, and there is an additional left shift by one to extract the mantissa The critical timing path can be further reduced by combining two instances where the $2^K$ term may be added. The circuit described in the following RTL code will accomplish this.

```
psum      <= a XOR b ;
sum_local <= (carry(126 downto 0) & '0') XOR psum ;
sum       <= sum_local ;
co31      <= (a( 31) AND b( 31)) OR (carry( 30) AND (a( 31) OR b( 31))) ;
co63      <= (a( 63) AND b( 63)) OR (carry( 62) AND (a( 63) OR b( 63))) ;
co95      <= (a( 95) AND b( 95)) OR (carry( 94) AND (a( 95) OR b( 95))) ;
co127     <= (a(127) AND b(127)) OR (carry(126) AND (a(127) OR b(127))) ;

--
-- Floating point mantissa generation
--

--
-- Single Precision word 0 calculation
--

-- Note: Use this trick for the sticky bit calculation --
-- The LS bit that is set in the product will have come from only one partial product.
    -- E.g., this means that if res = a + b, then
    -- or_reduce( res(N:0) ) == or_reduce( a(N:0) ) OR or_reduce( b(N:0) )
    -- Therefore we don't need to wait for the real sum to determine the sticky bit
    sp0_sticky_noshift  <= or_reduce( a(21 downto 0) ) OR or_reduce( b(21 downto 0) ) ;
    sp0_sticky_shift    <= sp0_sticky_noshift OR a(22) OR b(22) ;
    sp0_round_noshift   <= sum_local( 22 ) ;
    sp0_round_shift     <= sum_local( 23 ) ;
    sp0_man_lsb_noshift <= sum_local( 23 ) ;
    sp0_man_lsb_shift   <= sum_local( 24 ) ;
    WITH rnd_mode SELECT sp0_do_round_noshift <=
      sp0_round_noshift AND (sp0_man_lsb_noshift OR sp0_sticky_noshift)
    WHEN "00", -- Round to nearest even
```

```
          NOT sign_sp0_dp AND (sp0_round_noshift    OR sp0_sticky_noshift)
WHEN "10", -- Round to +infinity -- If we're positive and there's any
remainder, we round up. If we're neg, we tr
          sign_sp0_dp AND (sp0_round_noshift    OR sp0_sticky_noshift)
WHEN "11", -- Round to –infinity -- If we're negagive and there's any
remainder, we round up. If we're pos, we tr
      '0'
WHEN others; -- Truncate (round to zero)
    WITH rnd_mode SELECT sp0_do_round_shift <=
    sp0_round_shift AND (sp0_man_lsb_shift OR sp0_sticky_shift)
WHEN "00", -- Round to nearest even
      NOT sign_sp0_dp AND (sp0_round_shift    OR sp0_sticky_shift)
WHEN "10", -- Round to +infinity   -- If we're positive and there's any
remainder, we round up. If we're neg, we tr
          sign_sp0_dp AND (sp0_round_shift OR sp0_sticky_shift)
WHEN "11", -- Round to –infinity -- If we're negagive and there's any
remainder, we round up. If we're pos, we tr
      '0'
WHEN others; -- Truncate (round to zero)
------------------------------------------------------------------
--
-- a + b == c
-- a + b – c == 0
-- a + b + ~c + 1 == 0
-- a + b + ~c == –1
-- CAR + SUM == –1
--> bit-wise XOR between CAR (a AND b)<<1 vector and SUM vector (a
XOR b). Carry in bit goes into CAR(0)
--
-- We will use this circuit to determine what bits of the SUM of A + B
will be flipped if we end up rounding.
    consecutive_ones_sp0_base(24) <= '1';
    consecutive_ones_sp0_base_gen : FOR i IN 25 TO 47 GENERATE
      consecutive_ones_sp0_base(i) <= (psum(i) XOR aandb(i–1)) AND
consecutive_ones_sp0_base(i–1);
    END GENERATE;
    -- No-shift result
    consecutive_ones_sp0_noshift <= (OTHERS=>'0')           WHEN (
psum(23) XOR carry(22) ) = '0' ELSE
                    "000000000000000000000001"    WHEN (
psum(24) XOR aandb(23) ) = '0' ELSE
                    consecutive_ones_sp0_base( 46 downto 25
) & "11";
    mantissa_sp0_xor_mask_noshift <= (OTHERS=>'0') WHEN (
sp0_do_round_noshift = '0' ) ELSE
                    consecutive_ones_sp0_noshift(45 downto
23) & '1';
    mantissa_sp0_noshift <= mantissa_sp0_xor_mask_noshift XOR psum( 46
downto 23 ) XOR carry( 45 downto 22 );
    -- Shifted by 1 result
    consecutive_ones_sp0_shift <= (OTHERS=>'0') WHEN ( psum(24) XOR
carry(23) ) = '0' ELSE
                    consecutive_ones_sp0_base( 47 downto 25
) & '1';
    mantissa_sp0_xor_mask_shift <= (OTHERS=>'0') WHEN ( sp0_do_round_shift
= '0' ) ELSE
                    consecutive_ones_sp0_shift(46 downto
24) & '1';
    mantissa_sp0_shift <= mantissa_sp0_xor_mask_shift XOR psum( 47 downto
24 ) XOR carry( 46 downto 23 );
    sp0_do_extra_shift <= sum_local(47);
    mantissa_sp0 <= mantissa_sp0_shift WHEN sp0_do_extra_shift = '1'
ELSE
                    mantissa_sp0_noshift;
    incr_exp_sp0 <= sp0_do_extra_shift OR
mantissa_sp0_xor_mask_noshift(23);
    inexact_sp0 <= (sp0_sticky_noshift OR sp0_round_noshift) WHEN
sp0_do_extra_shift = '0' ELSE
                    (sp0_sticky_shift OR sp0_round_shift);
```

This improvement will eliminate one XOR gate delay, representing approximately 8% of the DSP clock cycle at 1.2 GHz on a Texas Instruments c66x DSP.

What is claimed is:

1. A computer implemented floating point multiplication method using a programmable central processing unit comprising the steps of:
   receiving first and second floating point operands;
   receiving an indication of a rounding mode;
   simultaneously
      calculating a first value of a temporary mantissa of a product of the first and second floating point operands if said indication of the rounding mode indicates no rounding, calculating a second value of the temporary mantissa of the product of the first and second floating point operands if said indication of the rounding mode indicates rounding up and no left shift of the temporary mantissa is needed, and calculating a third value of the temporary mantissa of the product of the first and second floating point operands if said indication of the rounding mode indicates rounding up and a left shift of the temporary mantissa is needed, and determining whether a left shift of the temporary mantissa is needed; and outputting a selected one of said first value, said second value or said third value as a mantissa of the product of the first and second floating point operands dependent upon said indication of the rounding mode and whether a left shift is needed.

* * * * *